United States Patent [19]

Poleshuk

[11] Patent Number: 4,461,071

[45] Date of Patent: Jul. 24, 1984

[54] PHOTOLITHOGRAPHIC PROCESS FOR FABRICATING THIN FILM TRANSISTORS

[75] Inventor: Michael Poleshuk, Webster, N.Y.

[73] Assignee: Xerox Corporation, Stamford, Conn.

[21] Appl. No.: 410,194

[22] Filed: Aug. 23, 1982

[51] Int. Cl.³ ............................................. H01L 21/31
[52] U.S. Cl. ................................. 29/571; 29/576 J; 29/578; 148/1.5; 357/4
[58] Field of Search ............... 29/571, 576 J, 578, 29/570; 357/23, 4, 71; 148/1.5; 427/86

[56] References Cited

U.S. PATENT DOCUMENTS

| | | | |
|---|---|---|---|
| 3,258,663 | 6/1966 | Weimer | 29/571 |
| 3,740,280 | 6/1973 | Ronen | 156/11 |
| 3,817,750 | 6/1974 | Kaiser | 96/36.2 |
| 3,914,127 | 10/1975 | Buss et al. | 96/36 |
| 3,982,943 | 9/1976 | Feng et al. | 96/38.4 |
| 4,040,073 | 8/1977 | Luo | 357/4 |
| 4,045,594 | 8/1977 | Maddocks | 427/89 |
| 4,123,564 | 10/1978 | Ajima et al. | 427/85 |
| 4,182,781 | 1/1980 | Hooper et al. | 427/90 |
| 4,186,410 | 1/1980 | Cho et al. | 357/67 |
| 4,224,361 | 9/1980 | Romankier | 427/259 |
| 4,331,758 | 5/1982 | Luo | 430/313 |
| 4,335,161 | 6/1982 | Luo | 427/86 |

FOREIGN PATENT DOCUMENTS 1523677 9/1978 United Kingdom .
1576055 1/1980 United Kingdom .

*Primary Examiner*—Brian E. Hearn
*Assistant Examiner*—David A. Hey

[57] ABSTRACT

A photolithographic method for fabricating thin film transistors and thin film transistor arrays in which the contamination vulnerable semiconductor-insulator interfaces are formed in a single vacuum pump-down operation. To minimize step coverage problems, quasi-planar construction is employed to provide a planar substructure for receipt of the deposited thin semiconductor layer.

4 Claims, 11 Drawing Figures

FROM IN-Au CONTACTS WITH ADDITIVE PROCESS

PHOTOLITHOGRAPHIC PROCESS FOR FABRICATING THIN FILM TRANSISTORS

BACKGROUND OF THE INVENTION

This invention broadly relates to thin film transistors, thin film transistor arrays, and to a method of preparing the same. More particularly, the invention concerns a complete photolithographic process for fabricating thin film transistors and thin film transistor arrays in which the critical, and contamination vulnerable, semiconductor-insulator interfaces are formed in a single vacuum pump-down.

Thin film transistors, and particularly an array of thin film transistors continue to be attractive drivers for active display panels, such as those incorporating liquid crystal or electroluminescent media. Because of the resolution achievable, photolithographic processes are particularly advantageous in the preparation of the high density thin film transistor arrays needed for such display panels.

It is well known to those practicing this art that the electrical performance and stability of thin film transistors are critically dependent upon the quality of the interfaces between the various layers of material forming the devices. Of special importance are the interfaces between the semiconductor and adjacent layers. It is also well known that the quality of these interfaces is greatest when the interfaces are prepared in a single vacuum pump-down operation.

The early efforts to employ a single pump-down technique focused upon the use of a multiple number of shadow masks within a vacuum system in order to deposit the proper shapes of the various component layers of the thin film transistors. These early multiple shadow mask processes are not altogether satisfactory, however, because of such problems as mask to mask registration and low resolution.

The problems occasioned by the use of multiple shadow masks are avoided in the process disclosed in U.S. Pat. No. 4,331,758 to Luo. In the disclosed process, during a single pump-down, a uniform layer of a semiconducting material is deposited onto a substrate. Thereafter, without breaking vacuum, a plurality of discrete areas of an insulating material is deposited onto the semiconductor layer through a single shadow mask. Then a uniform layer of a conducting material is deposited over the areas of insulating material and exposed portions of the semiconductive layer.

Yet another sequence for fabricating thin film transistors with a single shadow mask, single pump-down technique is shown in U.S. Pat. No. 4,335,161 to Luo. In that process, the opening (or openings for formation of thin film transistor arrays) in the mask is commensurate in size and shape to the semiconductor pads to be deposited. This mask is utilized, during a single vacuum pump-down, to deposit the semiconductive pad, the source and drain electrodes, and an insulating layer over the source and drain electrodes and the exposed portion of the semiconductive pad. The mask is moved in a simple bidirectional (180° reciprocating) manner between the successive depositions of the semiconductor material which forms the transistor pad and the conductive material which forms the two electrical contacts to the semiconductor pad.

As suggested hereinabove, photolithographic pattern delineation techniques excel over shadow mask techniques in providing the resolutions required to produce thin film transistor arrays suitable for drivers in high quality pictorial devices. Characteristically, such photolithographic techniques employ wet chemistry processes to selectively define patterned layers of conductive and insulative materials. Artisans skilled in this area recognize that exposure of the sensitive transistor interfaces to such wet processing results in impurity contamination which degrades the quality of the transistor characteristics. Commonly assigned U.S. Pat. No. 4,404,731 to Michael Poleshuk, granted Sept. 20, 1983 discloses a process for overcoming the disadvantages which can arise from exposure of the critical surfaces of the consituent layers of the thin film device to wet processing. This is achieved through the use of a single vacuum pump-down step in which the damage sensitive semiconductor is effectively sealed, or encapsulated, against subsequent wet processing. In the initial steps of this fabrication sequence a gate electrode is formed and covered with a layer of insulator. An additive photoresist mask is then formed for definition of the semiconductor pad. Thereafter, during a single vacuum pump-down, layers of insulator, semiconductor, and conductor (source-drain contact) layers are sequentially deposited to form the critical semiconductor-insulator interface and semi-source and drain contacts. During subsequent lift-off removal of the photoresist mask, the conductive contact layer functions as a protective cap over the semiconductor pad, preventing harmful interaction between the semiconductor and the stripping solution. After mask removal, the thin film transistor is completed by removal of the portion of the contact layer overlying the conducting channel of the semiconductor and definition of the source and drain network.

It has heretofore been recognized that technological problems are encountered in fabricating multi layered thin film transistors and transistor arrays. In particular, step coverage problems are prevalent when attempting to form electrical contact between circuit elements located at different levels. In one configuration of thin film transistors, for example, semiconductor films extend from the substrate level to source and drain pads on the next adjacent level. The gate oxide and electrode must necessarily follow the contour of the semiconductor films. The additional layers needed to complete the array, i.e. gate structures and crossovers, likewise follow the irregularity of this contour, producing a completed device consisting of a multi layered mesas with varied geometries and individual heights. Coverage of these mesas steps with continuous films of uniform thickness poses difficulties because of the sharply defined vertical edges of patterns delineated by processing steps such as photolithographic fabrication. A means for overcoming the step coverage problems is disclosed in commonly assigned, U.S. Pat. No. 4,389,481 to Michael Poleshuk et al. granted June 21, 1983 process disclosed therein, thin film transistors or an array of thin film are formed on a substrate by sequential deposition of a series of layers fabricated such that each element of the transistor structure is disposed in a planar relationship with respect to the next adjacent layer. In accordance with the process, the deposition of each of the elemental members of the thin film transistor structures is immediately followed by filling in the valleys between the elemental structures with an insulating material to form a planar surface. This planar surface, in turn, forms the surface upon which the succeeding planar layer is formed.

SUMMARY OF THE INVENTION

The present invention provides a process which takes advantage of the single vacuum pump-down technique for minimizing contamination of the critical thin film transistor interfaces. This single pump-down technique is incorporated into an all photolithographic process, thus realizing the high degree of control and resolution afforded thereby. During the one-pump-down step, the critical and contamination vulnerable semiconductor-insulator interfaces are formed by sequential deposition of a transistor gate insulator layer, a semiconductor pad, and a top insulator layer. The top insulator serves as a passivating layer on the free surface of the single gated thin film transistor, or as a top gate insulator in a double gated thin film transistor.

In addition to the one-pump-down formation of critical semiconductor-insulator interfaces and encapsulation of contamination vulnerable thin film transistor surfaces prior to wet processing, the present technique provides one-pump-down provision of a passivating layer for the free surface of single gated devices and one-pump-down formation of both gate insulator for double gated devices. As well, to minimize step coverage problems, a quasi-planar construction is employed. Thus, to eliminate the need for continuous coverage of the vertical source-drain electrode walls, a planar substructure for the thin semiconductor layer is provided. To further minimize contamination, dry plasma etching is employed to expose the source-drain contact areas on the semiconductor pad.

In accordance with one particularly advantageous embodiment, the fabrication sequence utilizes nickle, aluminum oxide, cadmium selenide, silicon dioxide, and indium-gold for the gate electrode, gate insulator, semiconductor, top insulator, and source and drain contacts, respectively. This sequence is initiated by the formation of a nickle gate electrode on a portion of a surface of a substrate by, for example, subtractive photolithographic delineation. Without removing the photoresist masks employed to delineate the nickle gate electrode, a planar structure is formed by depositing aluminum oxide over the substrate to a thickness substantially equal to the thickness of the gate electrode. A gate insulator layer is then formed on top of the planar surface. Thereafter, nickle source and drain electrodes (together with electrical bus lines for thin film transistor arrays) are formed on the gate insulator layer by, for example, subtractive processing. Again allowing the subtractive photoresist mask to remain in place, a second planar surface is formed by depositing aluminum oxide fill to a thickness substantially equal to the thickness of the source and drain electrodes (and bus bars). For definition of the semiconductor pad, an additive photoresist mask is then formed on top of the second planar surface. The aluminum oxide passivating layer, cadmium selenide, and silicon dioxide cap layers are then sequentially deposited through the apertures in the additive mask during a single vacuum pump-down to form the critical semiconductor-insulator interfaces. During subsequent lift-off removal of the photoresist mask, the silicon dioxide cap protects the semiconductor pad, preventing harmful interaction between the semiconductor and the stripping solution, i.e. the solvent per se or ionic species contained therein. After lift-off removal of the unwanted material and dissolution of the additive resist mask, portions of the silicon dioxide cap are selectively removed to define the transistor channel length and expose selected portions of the semiconductor layer for receipt of the indium-gold conductive contacts between the semiconductor and the source and drain electrodes. Preferably, these contacts are formed by additive processing.

In defining the transistor channel length, dry etching techniques, e.g. plasma etching, are preferred in lieu of the heretofore employed wet processing techniques. Thus, in removing the unprotected portions of the silicon dioxide layer, plasma etching is employed to expose the underlying cadmium selenide for source-drain contact areas. Thereafter, the resist mask is removed with an oxygen plasma.

DESCRIPTION OF THE PREFERRED EMBODIMENT

Figure 1:
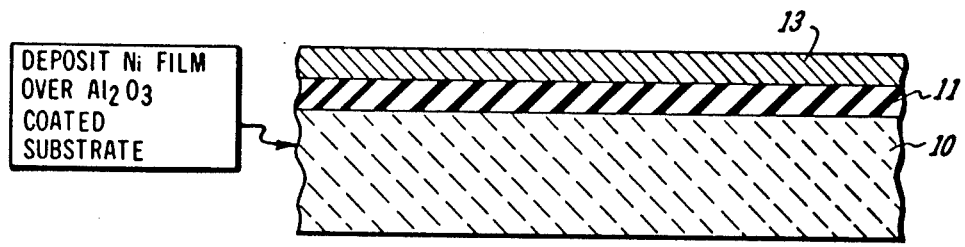
FIGS. 1–10 are diagrammatic cross-sectional views of a thin film transistor being fabricated in accordance with a preferred embodiment of the invention as well as a flow chart describing steps within the process.
Figure 2:
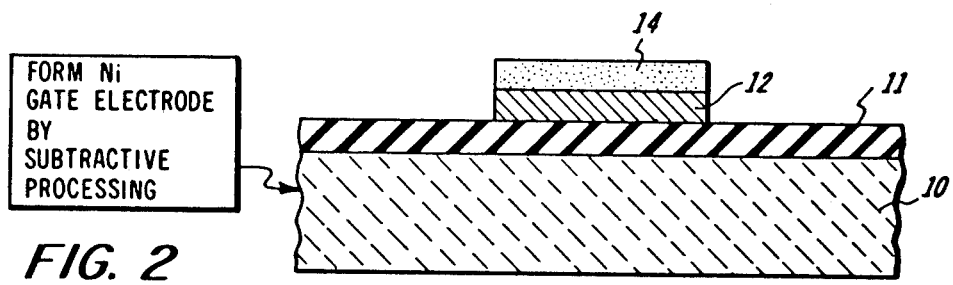

FIGS. 1 and 2 illustrate the formation of a gate electrode 12 upon a substrate 10. A broad range of materials may be employed for substrate 10, subject to the general limitation that the material chosen be insulative relative to the material selected for the gate electrode 12. The exact choice of a material for substrate 10 will, of course, depend upon the particular application in which the film transistor is utilized. When employed as a driver of an element in the liquid crystal display, as illustrated in FIG. 11, for example, substrate 10 would comprise one of the planar glass plates which are typically employed to contain the liquid crystal media. In other applications, utility may dictate that substrate 10 be composed of other insulative material, such as ceramics, semiconductors, plastic materials, and the like. Quite satisfactory results have been obtained with the use of a barium aluminum borosilicate composition sold commercially by Corning Glass Works of Corning, NY under the trademark Corning 7059 Glass. In FIGS. 1 through 10 such a Corning 7059 substrate is illustrated with an insulating (aluminum oxide) coating 11 to passivate the same.

A subtractive processing technique is utilized to form the gate electrode. In a conventional manner, this method begins with the deposition of a nickel film layer 13 on the aluminum oxide coated substrate. A covering layer of resist material is then applied to the upper surface of the nickel film layer 13. Thereafter, in accordance with well known photolithographic techniques, the resist layer is processed into a subtractive mask by the steps of exposure, development, and removal of selectively patterned areas thereof. The nickel gate electrode 12 is then formed by etching away portions of the nickel film layer 13 which are not protected by the overlying photoresist mask 14.

Figure 3:
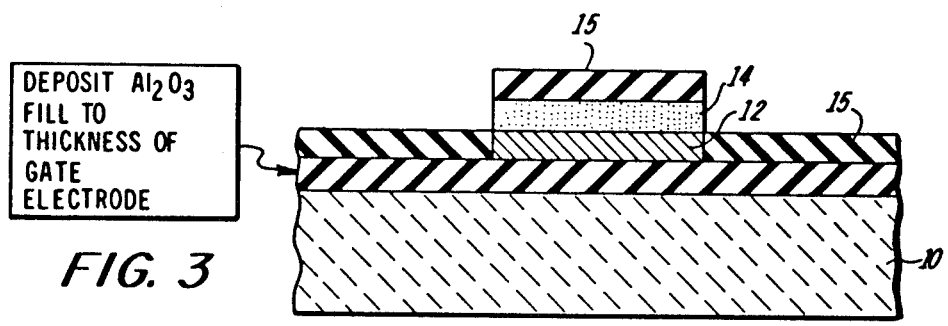
Figure 4:
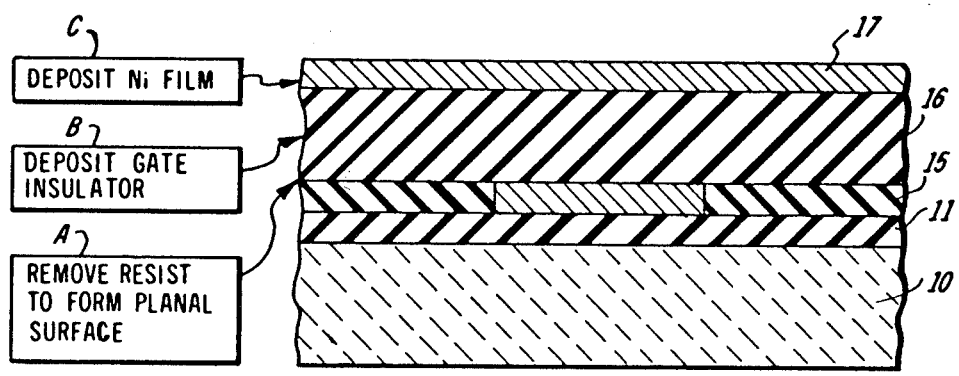
Figure 5:
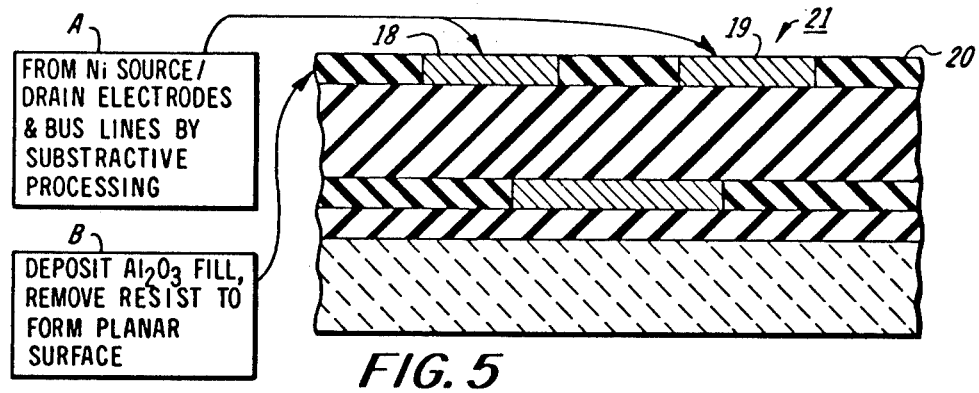

In the next step, as illustrated in FIG. 3, the resist mask 14 is left in place and employed in the formation of a planar structure. As illustrated, this is accomplished by depositing a layer of aluminum oxide over the substrate to fill in spaces adjacent the gate electrode 12. If an array of thin film transistors was being formed, this step would encompass filling all spaces between adjacent gate electrodes of the respective transistors. In a preferred process, a 500 Angstrom layer of nickel is employed in the formation of the gate electrode 12. Thus, the aluminum oxide fill layer 15 would be deposited to a thickness of 500 Angstrom. Suitable solvents are then utilized to dissolve away the resist mask 14 and lift-off unwanted areas of the aluminum oxide fill layer 15. This produces the first planar surface of this process, as shown most clearly by the arrow drawn from flow chart box A of FIG. 4. A blanket gate insulator (aluminum oxide) layer 16 is then deposited to a thickness of 4,500 Angstrom onto the first planar surface as illustrated in FIG. 4. To begin delineation of the source and drain electrodes (and the bus lines in a thin film transistor array) a uniform layer of nickel 17 is deposited to a thickness of 500 Angstrom onto the gate insulator layer 16.

Again employing subtractive processing, the source and drain electrodes (and electrical bus lines for an array) are formed. As with the subtractive process described in conjunction with forming the first planar layer (FIGS. 2 and 3), the subtractive resist mask remains over the conductive materials (here the nickel source and drain electrodes, 18 and 19, respectively). With this mask in place, an additional aluminum oxide layer 20 is deposited to fill the spaces between the source and drain electrodes (and bus lines for arrays). Subsequent removal of the resist mask and unwanted aluminum oxide overlying the same forms the second planar surface, generally indicated 21 in FIG. 5.

Figure 6:
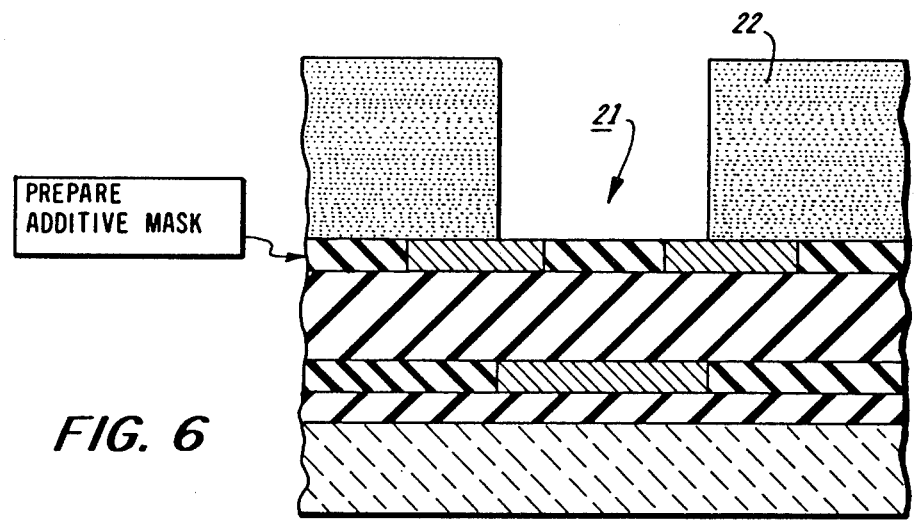
Figure 7:
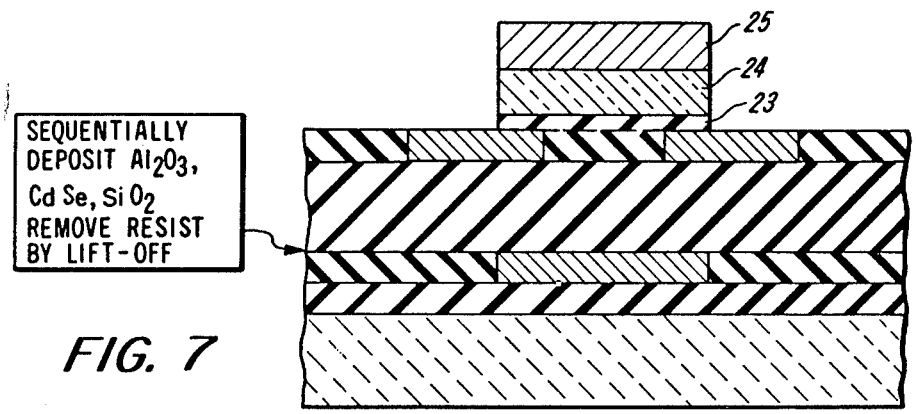

Thereafter, an additive resist mask 22 is prepared on top of the second planar surface 21 as shown in FIG. 6. The windows in the resist mask correspond to the desired dimensions of the semiconductor pad for the thin film transistor. The additive mask 22 is then used for depositing, in successive sequence, layers of insulator 23 (200 Angstrom of aluminum oxide), semiconductor 24 (500 Angstrom of CdSe), and an insulative cap 25 (1,000 Angstrom of silicon dioxide). It is of critical importance to the invention that these layers be deposited under the continuous vacuum of a single pump-down operation. This is accomplished by placing the structure of FIG. 6 into any suitable vacuum chamber and reducing the pressure thereof to about $5 \times 10^{-7}$ torr. Thereafter, utilizing conventional deposition techniques of the integrated circuit fabrication art, the layers of aluminum oxide, cadmium selenide, and silicon dioxide are deposited in succession without breaking vacuum. Utilizing a suitable solvent, the additive resist mask and unwanted material overlying the same is lifted off producing the structure shown in FIG. 7. As shown, what remains are portions of the deposited layer of aluminum oxide 23, cadmium selenide 24, and silicon dioxide 25.

Figure 8:
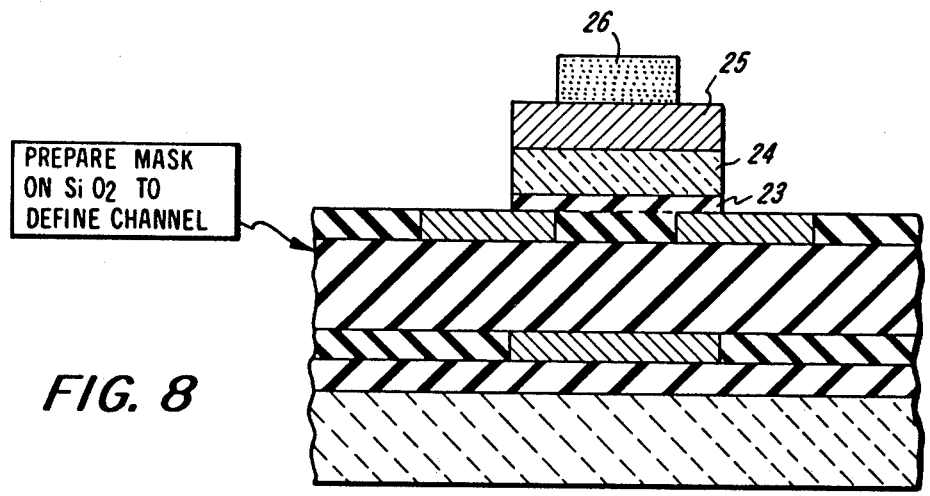
Figure 9:
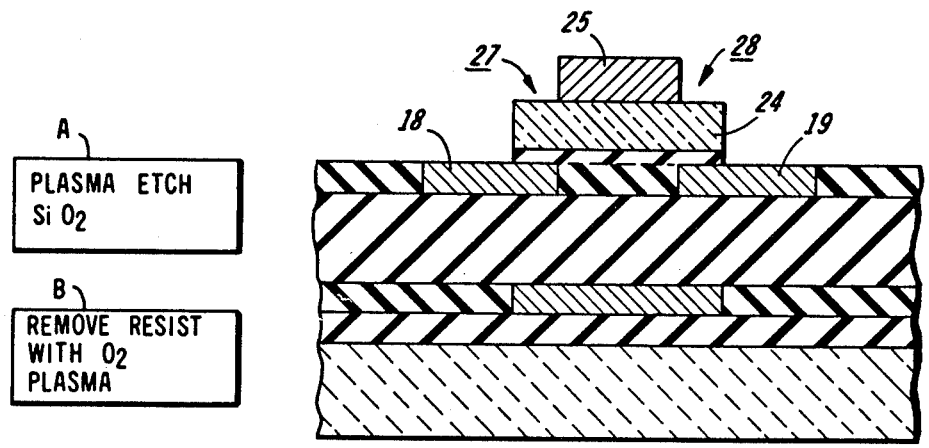

To define the transistor channel length, a resist mask 26 is formed on the silicon dioxide 25 as illustrated in FIG. 8. The unprotected areas of silicon dioxide are then etched with carbon tetrafluoride and oxygen plasma to expose areas of the underlying cadmium selenide for receipt of the source and drain contacts. Then utilizing an oxygen plasma, the resist mask 26 is removed to arrive at the structure of FIG. 9. In this Figure, the layer of silicon dioxide 25 is shown etched so as to expose the semiconductor source and drain contact areas, 27 and 28, respectively. Additive delineation (lift-off) is then utilized to complete the transistor by forming the suitable conductive contact between source and drain electrodes, 18 and 19, respectively, and the semiconductive pad 24. In the completed structure of FIG. 10, this conductive contact is provided by successively formed layers of indium 29 and gold 30.

Figure 10:
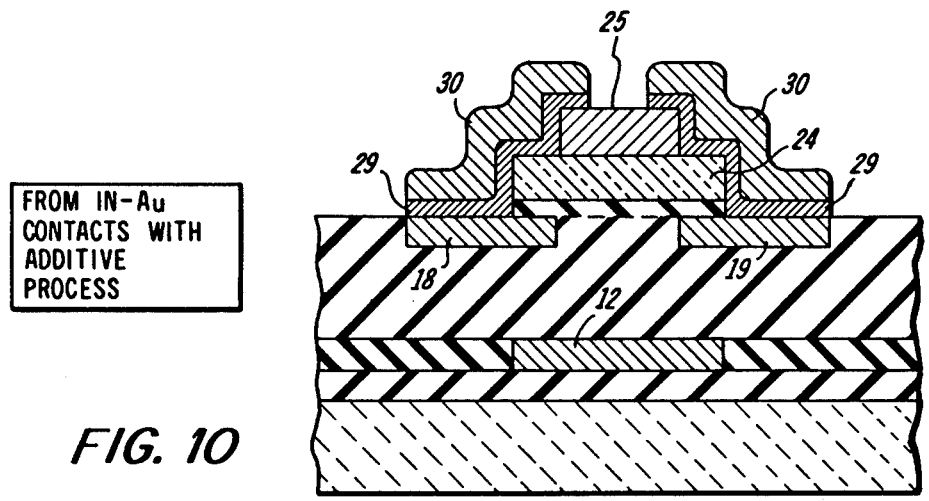
Figure 11:
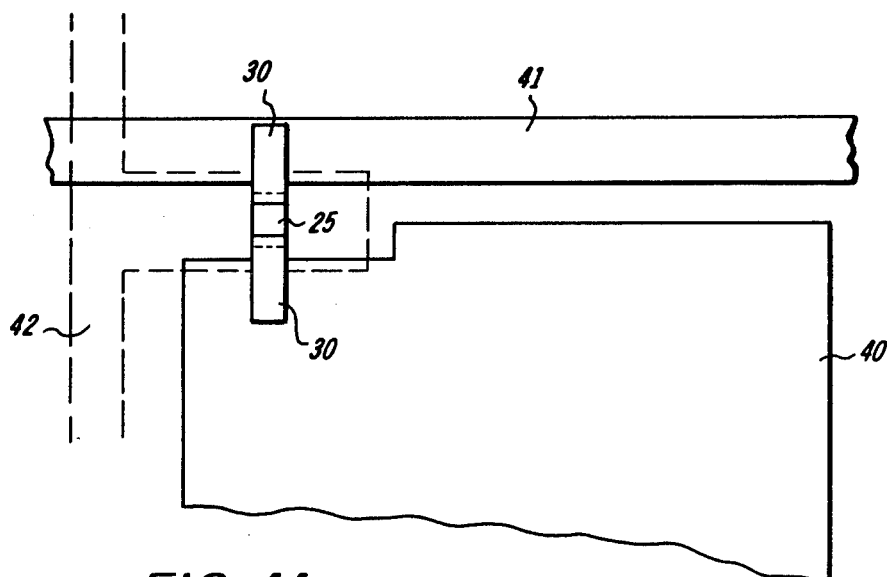
FIG. 11 is a diagrammatic plan view of a transistor fabricated in accordance with the invention and embodied as a driver for an element of a liquid crystal display.

FIG. 11 illustrates a plan view of the completed thin film transistor of FIG. 10 employed as a driver for a unit cell of a liquid crystal display. It will be appreciated, of course, that thin film transistors such as the ones prepared according to this process are suitable for use in active displays using other electrooptic media. In FIG. 11, the drain of the transistor is formed as part of an enlarged continuous drain pad 40. The source of the transistor is in electrical communication with a nickel source line 41 which, as well known to those familiar with this art, is shared by other transistors in the display matrix array. A shared, or common, gate bus line 42 is indicated by phantom line. This gate bus 42 corresponds to the burried gate electrode 12 of FIGS. 1-10. This view illustrates the arrangement of the transistor relative to these display elements showing, for clarity, the indium gold contacts 30 and exposed silicon dioxide cap. It will be appreciated that, for most applications, additional insulating, encapsulating, and/or protective layers of materials would be deposited over the structure shown in FIGS. 10 and 11.

I claim:

1. A method of photolithographically forming a thin film transistor of the type suitable for use as a driver of an element in a liquid crystal display, comprising the steps of:
    (a) forming a gate electrode of a predetermined thickness of conductive material on a portion of a surface of a passivating coating on a substrate by subtractive processing;
    (b) forming a first insulator layer on the remaining portions of the surface of said substrate coating not occupied by the gate electode, said insulator layer having a thickness substantially equal to the thickness of said gate electrode to thereby form a first planar surface;
    (c) forming a uniformly thick gate insulator layer on said first planar surface;
    (d) forming source and drain electrodes of predetermined equal thickness of conductive material on selected portions of said gate insulator layer by subtractive processing;
    (e) forming a second insulator layer on the remaining portions of the gate insulator layer not occupied by said source and drain electrodes, said second insulator layer having a thickness substantially equal to the thickness of said source and drain electrodes to thereby form a second planar surface;
    (f) forming, on said second planar surface, a masking layer having a predetermined opening therein exposing a portion of said second planar surface so that portions of said source and drain electrodes and a portion of said second insulator layer between said source and drain electrodes which lie in the second planar surface are exposed;
    (g) sequentially depositing, under continuous vacuum, a third insulator layer, a semiconductor layer, and a fourth insulator layer, respectively, on said masking layer and on the exposed portion of said second planar surface, so that the portions of the source and drain electrodes and the portion of the second insulator layer therebetween which are exposed through the opening in said masking layer are covered by said sequentially deposited layers without the need of a spaced, movable shadow mask;

(h) removing said masking layer and the portions of the third insulator layer, the semiconductor layer, and the fourth insulator layer deposited thereon;

(i) selectively removing portions of said fourth insulator layer to define a transistor channel length and to expose selected portions of said semiconductor layer; and (j) selectivly forming conductive contacts between the source and drain electrodes and said selected portions of the semiconductor layer.

2. The method of claim 1, wherein said step (i) comprises:

(i1) forming on said fourth insulator layer a photoresist masking layer having a predetermined pattern of openings therein exposing portions of said fourth insulator;

(i2) plasma etching the exposed portions of said fourth insulator layer to expose selected portions of said semiconductor layer; and (i3) removing said masking layer by plasma etching.

3. A method of forming a thin film transistor, comprising the steps of:

(a) forming a first composite layer on a surface of a substrate, said first composite layer having a substantially planar surface and including a first conductive film pattern defining at least one gate electrode surrounded by a first insulative film pattern;

(b) depositing a first insulator layer on the planar surface of said first composite layer;

(c) forming a second composite layer on said first insulator layer, said second composite layer having a substantially planar surface and including a second conductive film pattern surrounded by a second insulative film pattern, said second conductive film pattern defining at least source and drain electrodes;

(d) forming on said planar surface of said second composite layer a masking layer having at least one predetermined opening therein exposing portions of said source and drain electrodes and said second insulative film pattern between said source and drain electrodes;

(e) sequentially depositing, under continuous vacuum, a second insulator layer, a semiconductor layer, and a third insulator layer on said masking layer and on the exposed portions of said second composite layer, so that said sequentially deposited layers are formed on the second composite layer without the need of a positionable shadow mask;

(f) removing said masking layer and the portions of the second insulator layer, the semiconductor layer, and the third insulator layer deposited thereon;

(g) selectively removing portions of said third insulator to define a transistor channel length and to expose selected portions of said semiconductor layers; and (h) selectively forming conductive contacts between the source and drain electrodes and said selected portions of said semiconductor layer.

4. The method of claim 3, wherein said step (g) comprises:

(g1) forming on said third insulator layer, which only remains covering the semiconductor layer, a photoresist masking layer having a predetermined pattern therein which when subjected to a chemical etch will remove all of the masking layer except the predetermined pattern, so that portions of said third insulator are exposed;

(g2) plasma etching the exposed portions of said third insulator layer to remove it and expose selected portions of said semiconductor layer; and (g3) removing said predetermined pattern of the photoresist masking layer by plasma etching.

* * * * *